United States Patent [19]

Okui

[11] Patent Number: 4,702,788
[45] Date of Patent: Oct. 27, 1987

[54] METHOD OF RECEIVING SMALL-SIZED ELECTRONIC PARTS

[75] Inventor: Tokujiro Okui, Toyonaka, Japan

[73] Assignee: Uzo Tomii, Japan

[21] Appl. No.: 853,211

[22] Filed: Apr. 17, 1986

Related U.S. Application Data

[63] Continuation-in-part of Ser. No. 518,544, Jul. 29, 1983, abandoned.

[30] Foreign Application Priority Data

Feb. 28, 1983 [JP]  Japan .................................. 58-33635

[51] Int. Cl.[4] ............................................. B32B 31/00
[52] U.S. Cl. ..................................... 156/252; 156/257; 156/268; 156/291; 156/293; 156/324; 156/344; 206/330; 206/332; 428/40; 428/138
[58] Field of Search .................. 206/330, 332; 53/591; 156/250, 268, 257, 252, 256, 293, 306.6, 324, 514, 234, 291, 267, 344; 429/194; 428/40, 138, 906

[56] References Cited

U.S. PATENT DOCUMENTS 3,623,924 11/1971 De Winter ........................... 156/267
3,918,988 11/1975 Abens .................................. 429/194
3,953,274 4/1976 Winrow et al. ..................... 156/252
4,298,120 11/1981 Kaneko et al. ..................... 206/332
4,302,492 11/1981 Hutter, III .......................... 156/234
4,406,367 9/1983 Bouwknegt .......................... 206/332

*Primary Examiner*—Jay H. Woo
*Assistant Examiner*—Timonthy W. Heitbrink
*Attorney, Agent, or Firm*—Sideny W. Millard

[57] ABSTRACT

A number of holes for individually receiving small-sized electronic parts such as chip capacitors and ceramic capacitors are formed in a strip of carrier tape to preserve these parts. The carrier tape is made of a strip of base material and a strip of double-sided adhesive tape stuck on one surface of the base material such that the area of each portion of the adhesive layer exposed through the holes is smaller than the area of each hole. The base material is made of an electrically conductive material. Alternatively, the base material may be made of nonconductive material and the surface may be treated so as to be electrically conductive. Incisions are formed in the adhesive layer to facilitate removal of the adhesive in withdrawing the electronic parts from the tape. When the electronic parts are inserted in the holes, they are stuck on the adhesive layer, and then the tape is wound on a reel for storgage.

12 Claims, 7 Drawing Figures

METHOD OF RECEIVING SMALL-SIZED ELECTRONIC PARTS

This application is a continuation-in-part of application Ser. No. 518,544, filed July 29, 1983, now abandoned.

FIELD OF THE INVENTION

The present invention relates to a method of receiving and preserving small-sized electronic parts for use in an electronic apparatus such as a computer or the like as, for example, chip capacitors, ceramic capacitors, resistors, flat package ICs and so forth.

BACKGROUND OF THE INVENTION

Since the aforementioned small-sized electronic parts such as chip capacitors and ceramic capacitors are primarily used in computer applications, they are employed in huge quantities, say, on the order of hundreds of millions, at a time. Accordingly, the industry has sought for a good way of packing and preserving such a quite large number of minute parts. Recently, a strip of tape generally called carrier tape has been used to receive small-sized electronic parts therein and wind the tape carrying the parts on a reel.

More specifically, a strip of carrier tape which has recesses of a given dimension and sprocket holes formed at regular intervals has generally been used to receive small-sized electronic parts in the recesses and wind the tape on a reel. The tape is made of paper or plastic.

When the parts received in the tape described above are to be used, the tape coiled about the reel is unwound and the parts are withdrawn from the tape by suction or other means. Generally, electronic parts of this kind are securely fixed by soldering after provisional attachment with adhesive.

In the conventional method using carrier tape, however, each individual part is received directly in the tape and so after the parts are withdrawn from the tape for use in electronic equipment or similar apparatus, adhesive must be applied to them for provisional attachment. In particular, provisional attachment has been heretofore effected by applying parts withdrawn from carrier tape, or previously applying adhesive or sticking double-sided adhesive pieces to the electronic equipment. Therefore, such an operation has been effected in an inefficient manner.

Further with conventional carrier tapes, electronic parts received in the holes in the tapes have adhered to those holes because of static electricity and therefore it has not been easy to separate the parts from the hole. Hence, withdrawal of the parts has not been done smoothly, or the parts have adhered to the back side of such tape when the tape receiving the parts is wound on a reel.

SUMMARY OF THE INVENTION

It is the main object of the present invention to provide a method for facilitating and expediting provisional attachment of parts withdrawn from carrier tape by dispensing with application of adhesive for provisional attachment or fastening of double-sided adhesive pieces either to those parts or to an electronic equipment, and for solving the problems associated with static electricity.

In one feature of the invention, adhesive for provisional attachment is previously applied to carrier tape to allow individual electronic parts to be withdrawn from the tape while the adhesive remains stuck on the parts.

In another feature of the invention, the problems associated with static electricity are solved by using an electrically conductive material for the base material of tape or using a material treated so as to be electrically conductive, i.e. have an antistatic property.

The method of receiving small-sized electronic parts in a strip of tape is characterized by forming a number of receiving holes and sprocket holes in the base material of the tape, sticking a strip of double-sided adhesive tape to one side of the base material such that the area of each portion of the double-sided adhesive layer exposed through the receiving holes is smaller than the area of each receiving hole, inserting individual electronic parts in the receiving holes through which the adhesive layer is exposed to stick the parts on the adhesive layer, and winding the tape around a reel. Further, the method is characterized by making incisions in the double-sided adhesive layer of the double-sided adhesive tape to improve removal of adhesive in withdrawing the parts. In addition, the method is characterized by using an electrically conductive material for the base material of the tape, or treating the surface of the base material so as to be electrically conductive.

Other objects and features of the invention will appear in the course of the description thereof which follows.

DETAILED DESCRIPTION OF THE INVENTION

Figure 1:
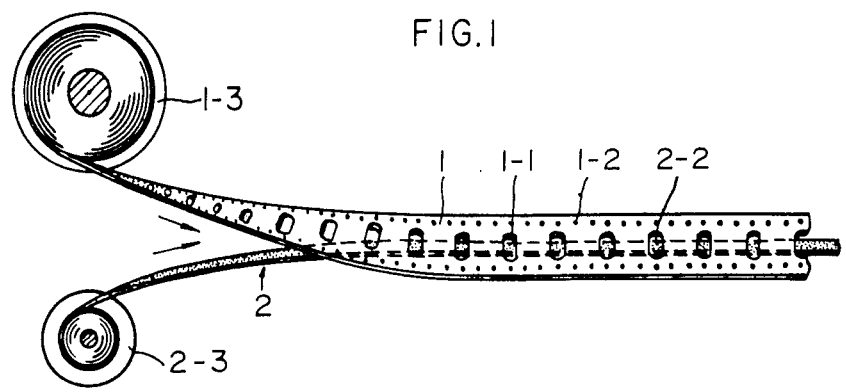
FIG. 1 is a perspective view of one example of a part receiving tape according to the present invention.

Referring first to FIG. 1, the base material 1 of a strip of tape consists of an electrically conductive material or a nonconductive material whose surface is treated so as to be conductive. The base material 1 is provided with a number of holes 1-1 for receiving individual electronic parts and also a number of sprocket holes 102. The holes 101 and 102 are each disposed at regular intervals. A strip of double-sided adhesive tape 2 is stuck on one face of the base material of the tape, whereby completing a strip of carrier tape for receiving individual electronic parts. The adhesive includes a first portion visible through the holes 1-1 and a second portion not visible. Examples of conductive materials used for the base material 1 include the mixture of paper fibers and carbon black. Also, the base material of the tape may be produced by sticking a strip of conductive paper or film on a strip of nonconductive paper or film to form a two-layer structure.

Figure 2A:
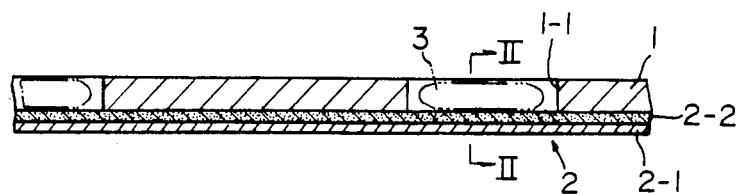
FIG. 2A is an enlarged side elevation in section of the tape of FIG. 1.
Figure 2B:
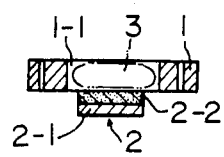
FIG. 2B is a cross-sectional view taken on the line II—II of FIG. 2A.

As shown in FIGS. 2A and 2B, the double-sided adhesive tape 2 consists of a strip of release paper 2-1 and a double-sided adhesive layer 2-2 struck on one surface of the release paper. The area of each first portion of the adhesive layer 2-2 which is exposed through the holes 1-1 in the base material 1 is made smaller than the area of each hole 101. This facilitates adhesion of individual electronic parts to the double-sided adhesive layer 2-2 exposed through each hole 1-1 and helps remove the adhesive 2-2 in withdrawing the stuck, individual electronic parts. That is, a slight space in each receiving hole under which the double-sided adhesive tape is stuck facilitates attachment and detachment of individual electronic parts. For this reason, the width of the adhesive tape is limited. As illustrated in FIG. 2B, the release paper 2-1 is at least as wide as the adhesive 2-2 to prevent the adhesive from sticking to other things.

The base material 1 of the tape can be wound round a reel 1-3 after forming the holes 1-1 and sprocket holes 1-2 by means of a puncher, press machine equipped with a punching tool (not shown) or similar means. Similarly, the double-sided adhesive tape 2 can be coiled about a reel 2-3. In this case, the base material 1 of the tape and the adhesive tape 2 may be laid and stuck on top of each other while being unwound from their respective reels. After sticking the double-sided adhesive layer 2-2 on one surface of the base material 1, the completed carrier tape is wrapped about the other reel (not shown).

When small-sized electronic parts are to be received in the tape where the double-sided adhesive layer 2-2 is stuck on one surface of the base material 1, each individual part 3 is inserted in the holes 1-1 while the tape is being unwound from the reel, and then each part is stuck on the adhesive layer 2-2. The carrier tape is then coiled about another reel to preserve the electronic parts. Since the side of the release paper remote from the adhesive 2-2 is already aligned, inherently it will cover the open side of the holes 1-1 containing the parts 3 with the obvious beneficial effects. When the small-sized electronic parts received and preserved in the carrier tape in this way are to be used, the tape is unwound from the reel and the electronic parts are taken out from the holes 1-1 by suction or similar means. At this time, if each individual part is sucked from above, it is peeled from the release paper 2-1 while a piece of the double-sided adhesive 2-2 remains stuck on it, because each part is fastened on the adhesive layer 2-2. In other words, the adhesive 2-2 adheres to the part 3 more strongly than it does to the release paper 2-1 and under tension the adhesive separates from the release paper and remains adhered to the electronic part.

Figure 3:
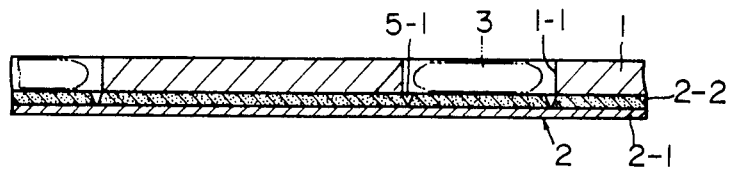
FIGS. 3 and 4 are views similar to FIG. 2A, for illustrating other examples of tape of the invention.
Figure 4:
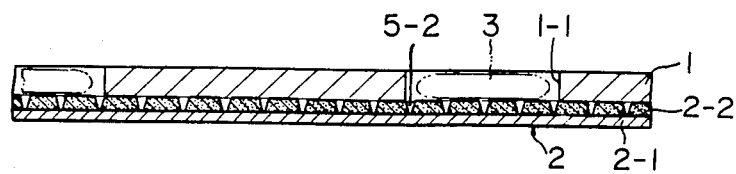
Figure 5:
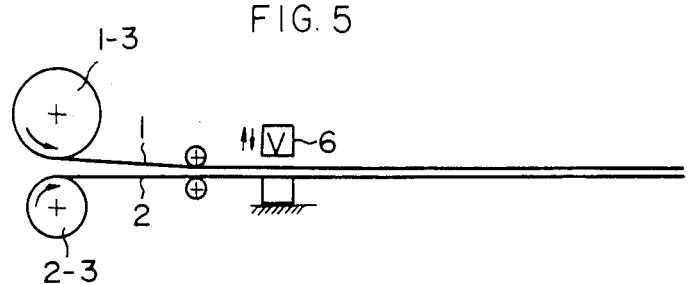
FIGS. 5 and 6 each schematically show the manner in which incisions are formed in the double-sided adhesive layers of said tapes.
Figure 6:
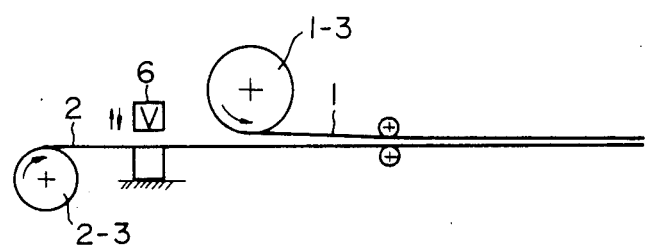

The present invention is further characterized in that incisions 5-1 or 5-2 are made in the double-sided adhesive layer 2-2 which is regularly exposed through the holes 1-1, as shown in FIGS. 3 and 4, to facilitate removal of the adhesive 2-2. In the method of forming the incisions as shown in FIG. 3, the incisions 5-1 may be formed in the exposed portions as by a cutting device 6 after the double-sided adhesive tape 2 is stuck on the base material 1 of the carrier tape, as shown in FIG. 5. In case where the incisions 5-2 are formed at random as shown in FIG. 4, the incisions may be formed as by the cutting device 6 before the adhesive tape 2 is stuck on the base material 1, as shown in FIG. 6.

When the incisions 5-1 or 5-2 are formed in the double-sided adhesive layer 2-2, the removal of the adhesive, is made much easier since only a small attractive force is necessary to withdraw the individual electronic parts.

Each individual electronic part withdrawn from the carrier tape has a piece of the adhesive stuck on its one side and therefore these parts can be provisionally and directly attached to a component of electronic equipment without the need to apply any adhesive means which has been heretofore required. Further, since the base material of the carrier tape is electrically conductive, occurrence of static electricity that causes electronic parts to adhere to the carrier tape can be completely avoided.

As described hereinbefore, electronic parts can be withdrawn from carrier tape while adhesive for provisional attachment remains stuck on the parts, in accordance with the present invention. Consequently, operation for applying adhesive for provisional attachment or fastening a doublesided adhesive layer is made unnecessary, thus simplifying and facilitating the provisional attachment operation. In addition, since the occurrence of static electricity can be circumvented, electronic parts can be taken out smoothly from the carrier tape. Further, parts can also be inserted in the tape smoothly and certainly. Consequently, the present invention greatly contributes to the industry manufacturing small-sized electronic parts and also to the industry manufacturing electronic apparatuses such as computer.

While preferred embodiments have been described using specific terms, variations and changes thereto will occur to those skilled in the art within the scope of the present invention which is delineated by the following claims.

I claim:

1. A process for packaging electronic parts comprising:

providing an elongated strip of flexible material, said strip having a surface and a length, said material having a physical characteristic of conducting electricity to an extent necessary to prevent attachment of electronic parts to the surface of said strip by static electricity, punching a series of aligned holes in said strip, said holes being aligned in rows along the length of the elongated strip, adhesively bonding one side of a double-sided adhesive strip to one side of the elongated strip over one row of said series of holes, a first portion of said adhesive strip being visible through each hole and a second portion of said adhesive strip not being visible through said holes, each said hole in said one row having a width perpendicular to the length of the elongated strip, bonding a strip of release paper to the other side of the double-sided adhesive strip, said strip of release paper being of a width at least as great as the adhesive strip, said strip of release paper having two sides with (1) one side being in contact with the adhesive strip and (2) the other side not contacting the adhesive strip, inserting an electronic part into each of at least some of the holes of said one row and into contact with said first portion and adhesively bonding said parts to the first portions of said adhesive strip which are exposed through said one row of holes, each said first portion of said adhesive strip having a physical characteristic of releasing from said strip of release paper and from the second portion of said adhesive strip which is not exposed through said one row of holes while remaining bonded to said part in which said portion is in contact when force is applied to remove said part from said hole, and while leaving the holes in said one row unobstructed from one side of the elongated strip rolling the elongated strip, electronic parts, adhesive strip and release paper into a coil in a direction, the direction of rolling being along the aligned row of holes whereby the other side of the release paper covers said unobstructed holes.

2. The process of claim 1 including forming incisions in said adhesive strip whereby when force is applied to remove an electronic part from its hole, a discrete portion of the adhesive strip defined by the incisions remains bonded to said electronic part being removed.

3. The process of claim 2 wherein another row of said series of holes formed in the elongated strip is formed adjacent to and out of contract with one edge of the elongated strip, whereby said another row of holes may serve as a means for moving the elongated strip by a sprocket wheel.

4. The process of claim 3 wherein the elongated strip includes a mixture of paper fibers and carbon black.

5. The process of claim 2 wherein the incisions are made in the adhesive strip prior to the time said adhesive strip is bonded to the elongated strip.

6. The process of claim 2 wherein the incisions are made in the adhesive strip subsequent to the time said adhesive strip is bonded to the elongated strip.

7. A process for packaging electronic parts, storing said electronic parts and subsequently using at least one of said parts, said process comprising;

providing an elongated strip of flexible material, said strip having a surface and a length, said material having a physical characteristic of conducting electricity to an extent necessary to prevent attachment of electronic parts to the surface of said strip by static electricity, punching a series of aligned holes in said strip, said holes being aligned in rows along the length of the elongated strip, adhesively bonding one side of a double-sided adhesive strip to one side of the elongated strip over one row of said series of holes, a first portion of said adhesive strip being visible through each hole and a second portion of said adhesive strip not being visible through said holes, each said hole in said one row having a width perpendicular to the length of the elongated strip, the width of said adhesive strip being less than the width of each said hole, bonding a strip of release paper to the other side of the double-sided adhesive strip, said strip of release paper being of a width at least as great as the adhesive strip, said strip of release paper having two sides with (1) one side being in contact with the adhesive strip and (2) the other side not contacting the adhesive strip, inserting an electronic part into each of at least some of the hole of said one row and into contact with said first portion and adhesively bonding said parts to the first portions of said adhesive strip which are exposed through said one row of holes, each said first portion of said adhesive strip having a physical characteristic of releasing from said strip of release paper and from the second portion of said adhesive strip which is not exposed through said one row of holes while remaining bonded to said part in which said portion is in contact when force is applied to remove said part from said hole, while leaving the holes in said one row unobstructed from one side of the elongated strip rolling the elongated strip, electronic parts, adhesive strip and release paper into a coil in a direction the direction of rolling being along the aligned row of holes whereby the other side of the release paper covers said unobstructed holes; and removing at least one electronic part from the hole where it was previously inserted by application of a vacuum and the part so removed is then bonded to a component of electronic equipment solely by the adhesive on the part which separated from the release strip with the part when said part was removed from the hole.

8. The process of claim 7 including forming incisions in said adhesive strip whereby when force is applied to remove an electronic part from its hole, a discrete portion of the adhesive strip defined by the incisions remains bonded to said electronic part being removed.

9. The process of claim 8 wherein another row of said series of holes formed in the elongated strip is formed adjacent to and out of contact with one edge of the elongated strip, whereby said another row of holes may serve as a means for moving the elongated strip by a sprocket wheel.

10. The process of claim 9 wherein the elongated strip includes a mixture of paper fibers and carbon black.

11. The process of claim 8 wherein the incisions are made in the adhesive strip prior to the time said adhesive strip is bonded to the elongated strip.

12. The process of claim 8 wherein the incisions are made in the adhesive strip subsequent to the time said adhesive strip is bonded to the elongated strip.

* * * * *